United States Patent
Tsai et al.

(10) Patent No.: US 10,492,348 B2
(45) Date of Patent: Nov. 26, 2019

(54) SELECTIVELY PLATED ROLLS OF MATERIALS AND RELATED METHODS

(71) Applicant: Laird Technologies, Inc.

(72) Inventors: Richard Tsai, Xinbei (TW); Dusan Lee, Shenzhen (CN); Larry Don Creasy, Jr., St. Clair, MO (US)

( * ) Notice: Subject to any disclaimer, the term of this patent is extended or adjusted under 35 U.S.C. 154(b) by 0 days.

(21) Appl. No.: 15/947,080

(22) Filed: Apr. 6, 2018

(65) Prior Publication Data

US 2018/0235115 A1    Aug. 16, 2018

Related U.S. Application Data

(63) Continuation of application No. PCT/US2016/052642, filed on Sep. 20, 2016.

(30) Foreign Application Priority Data

Oct. 8, 2015 (CN) .......................... 2015 1 0646050
Oct. 8, 2015 (CN) ..................... 2015 2 0776297 U

(51) Int. Cl.
*H05K 9/00* (2006.01)
*H05K 3/38* (2006.01)
(Continued)

(52) U.S. Cl.
CPC ......... *H05K 9/0084* (2013.01); *C23C 18/161* (2013.01); *C23C 18/163* (2013.01);
(Continued)

(58) Field of Classification Search
CPC ............ H05K 3/381; Y10T 428/24802; Y10T 428/24826; Y10T 428/2962; Y10T 428/31786
See application file for complete search history.

(56) References Cited

U.S. PATENT DOCUMENTS 4,560,445 A    12/1985    Hoover et al.
4,910,072 A     3/1990    Morgan et al.
(Continued)

FOREIGN PATENT DOCUMENTS

CN    101569247 A    10/2009
CN    102245827 A    11/2011
(Continued)

OTHER PUBLICATIONS

International Search Report and Written Opinion dated Jan. 5, 2017 for PCT application No. PCT/US2016/052642 filed Sep. 20, 2016, which claims priority to the same parent application as the instant application, 13 pages.

(Continued)

*Primary Examiner* — Betelhem Shewareged
(74) *Attorney, Agent, or Firm* — Harness, Dickey & Pierce, P.L.C.; Anthony G. Fussner

(57) ABSTRACT

According to various aspects, exemplary embodiments are disclosed of selectively metal-plated rolls of materials, rolls of materials configured for selective metal plating, and methods for selectively plating rolls of materials. In an exemplary embodiment, a roll of material includes a substrate. An insulating ink is on the substrate. A catalyst coating is on the substrate whereat the insulating ink is not present. The catalyst coating may be configured to provide the substrate with one or more catalytic surfaces suitable for electroless deposition of metal. Accordingly, metal plating may be electrolessly deposited on the catalyst coating without over-plating the insulating ink.

20 Claims, 10 Drawing Sheets

(51) Int. Cl.
*C23C 18/16* (2006.01)
*C23C 18/38* (2006.01)
*C23C 18/20* (2006.01)
*C23C 18/30* (2006.01)
*C23C 18/40* (2006.01)

(52) U.S. Cl.
CPC ...... *C23C 18/1605* (2013.01); *C23C 18/1608* (2013.01); *C23C 18/1614* (2013.01); *C23C 18/1641* (2013.01); *C23C 18/1646* (2013.01); *C23C 18/1653* (2013.01); *C23C 18/2066* (2013.01); *C23C 18/30* (2013.01); *C23C 18/38* (2013.01); *H05K 3/381* (2013.01); *C23C 18/405* (2013.01); *Y10T 428/24802* (2015.01); *Y10T 428/24826* (2015.01); *Y10T 428/2962* (2015.01); *Y10T 428/31786* (2015.04)

(56) References Cited

U.S. PATENT DOCUMENTS

| | | | |
|---|---|---|---|
| 5,075,037 A | | 12/1991 | Morgan et al. |
| 5,082,734 A | | 1/1992 | Vaughn |
| 5,227,223 A | | 7/1993 | Morgan et al. |
| 5,306,334 A | * | 4/1994 | Martyak ............... D06M 11/83 106/1.22 |
| 5,328,750 A | | 7/1994 | Morgan et al. |
| 5,348,574 A | | 9/1994 | Tokas et al. |
| 5,403,649 A | | 4/1995 | Morgan et al. |
| 5,411,795 A | | 5/1995 | Silverman |
| 5,437,916 A | | 8/1995 | Morgan et al. |
| 5,604,026 A | * | 2/1997 | King .......................... C09J 9/02 428/317.1 |
| 5,877,256 A | * | 3/1999 | Nakamura ........... C09D 183/04 524/720 |
| 6,395,402 B1 | | 5/2002 | Lambert et al. |
| 7,255,782 B2 | | 8/2007 | Crouse |
| 7,505,275 B2 | | 3/2009 | Reis et al. |
| 7,683,785 B2 | | 3/2010 | Johnson |
| 7,889,502 B1 | | 2/2011 | Reis et al. |
| 8,318,254 B2 | | 11/2012 | Sung et al. |
| 8,323,739 B2 | | 12/2012 | Sung et al. |
| 8,492,077 B2 | | 7/2013 | Palin |
| 2007/0013600 A1 | | 1/2007 | Sullivan et al. |
| 2009/0176012 A1 | | 7/2009 | Way et al. |
| 2010/0151120 A1 | | 6/2010 | Bai et al. |
| 2011/0217892 A1 | | 9/2011 | Chabrecek et al. |
| 2011/0281123 A1 | * | 11/2011 | Yoshida ................. C08L 83/04 428/447 |
| 2012/0031656 A1 | | 2/2012 | Oka et al. |
| 2012/0291275 A1 | | 11/2012 | Rha et al. |
| 2013/0075946 A1 | | 3/2013 | Petcavich |
| 2015/0125596 A1 | | 5/2015 | Ramakrishnan et al. |

FOREIGN PATENT DOCUMENTS

| | | |
|---|---|---|
| CN | 102817232 A | 12/2012 |
| CN | 104412451 A | 3/2015 |
| EP | 2894241 A1 | 7/2015 |
| KR | 10-1377273 B1 | 3/2014 |
| KR | 10-1535864 B1 | 7/2015 |
| WO | WO-2007011652 A2 | 1/2007 |

OTHER PUBLICATIONS

Laird Technologies Introduces Thermally Conductive TPREGTM HTD with High Operating Temperature and Voltage Ratings, http://lairdtech.com/newsItemPrint.aspx?id=969, Copyright 2010, 2 pages.

Thermally Conductive PCB Materials, HTTP://www.lairdtech.com/Prodcuts/Thermal-Management-Solutions/Thermally-Conductiv . . . accessed Mar. 26, 2014, 8 pages.

Chinese Office Action for Chinese Application No. 201510646050.1 which is the parent application to the instant application, dated Jul. 2, 2018, 18 pages.

Partial European Search Report for European patent application No. 16854064.9 which claims priority to the same parent application as the instant application; dated Oct. 19, 2018, 14 pages.

* cited by examiner o- 2mm
p- 20mm
w- 20mm

SELECTIVELY PLATED ROLLS OF MATERIALS AND RELATED METHODS

CROSS-REFERENCE TO RELATED APPLICATIONS

This application is a U.S. continuation application that claims priority to and the benefit of PCT International Application No. PCT/US2016/052642 filed Sep. 20, 2016 (published as WO 2017/062173 on Apr. 13, 2017), which, in turn, claims priority to Chinese Invention Patent Application No. 201510646050.1 filed Oct. 8, 2015 and to Chinese Utility Model Application No. 201520776297.0 filed Oct. 8, 2015. The entire disclosures of the above applications are incorporated herein by reference.

FIELD

The present disclosure generally relates to selectively plated rolls of materials and related methods.

BACKGROUND

This section provides background information related to the present disclosure which is not necessarily prior art.

Metal plated materials are currently used for making a variety of electronic products. Plated fabrics, for example, may be used in making electromagnetic interference (EMI) shielding and for other purposes.

DRAWINGS

The drawings described herein are for illustrative purposes only of selected embodiments and not all possible implementations, and are not intended to limit the scope of the present disclosure.

DETAILED DESCRIPTION

Figure 1:
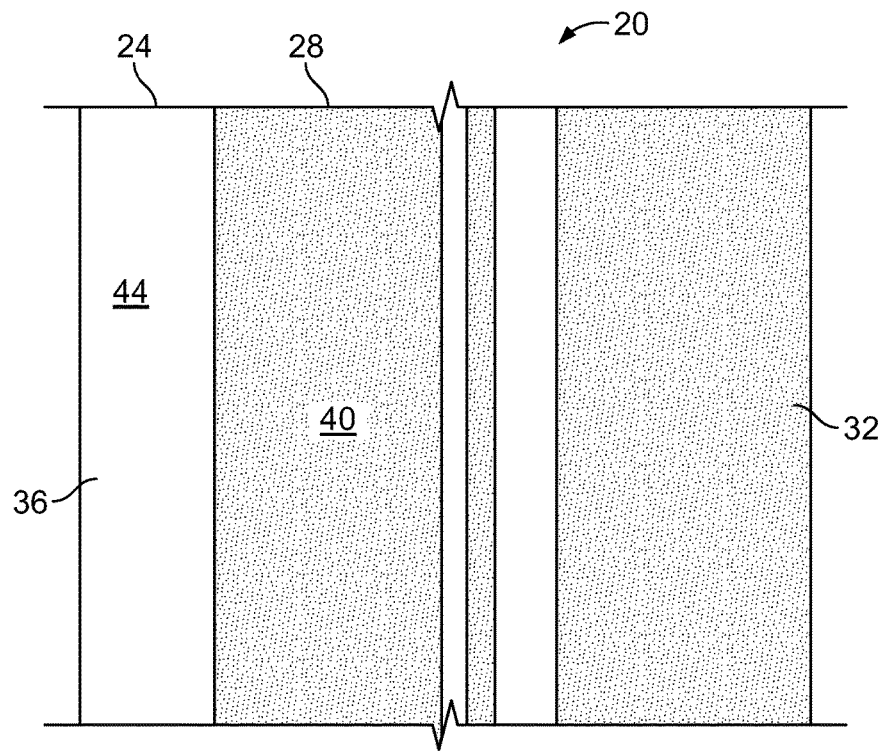
FIG. 1 is a top view of a selectively plated material according to an exemplary embodiment.

Example embodiments will now be described more fully with reference to the accompanying drawings.

The inventors have observed that difficulties can arise during processes in which metal plating is electrolessly deposited on fabrics and other materials. For example, in processes in which a metal is heat-embossed onto a selected portion of a material, portions of the material that were not selected for metal plating can become over-plated. It can be difficult to control the interaction of active catalytic surfaces with copper in order to electrolessly deposit the copper onto the active surfaces without producing undesirable effects, such as over-plating.

Accordingly, disclosed herein are exemplary embodiments of selectively plated materials (e.g., selectively plated rolls of fabrics, etc.) and materials (e.g., rolls of fabrics, etc.) configured for selective metal plating. Also disclosed are exemplary methods for configuring materials (e.g., rolls of fabrics, etc.) for selective metal plating, and exemplary methods for selectively plating materials (e.g., rolls of fabrics, etc.) that are provided, e.g., in roll form, etc.

In an exemplary embodiment, a roll of material (e.g., a roll of fabric material, etc.) may go through a series of unrolling and rerolling steps at each process while the roll of material is being selectively plated. For example, the roll of material may be unrolled, and then an insulating ink (e.g., silicone-based ink, etc.) may be printed or otherwise applied to the unrolled material. The material with the insulating ink thereon may then be rerolled after the insulating ink is dry and transported to a different location, such as a catalyst coating station, etc. The roll of material with the insulating ink thereon may then be unrolled again and a catalyst coating may be applied to the unrolled material. The material with the catalyst coating thereon may then be rerolled again after the catalyst coating is dry and transported to another different location, such as a metal plating station, etc. The roll of material with the catalyst coating thereon may then be unrolled again and metal plated. The metal-plated material may then be rerolled again and transported to additional locations for further treatment, such as for a corrosion inhibitor coating (e.g., benzotriazole (BTA), etc.), an anti-oxidant coating (e.g., polyurethane, etc.), and/or an abrasion resistant coating (e.g., urethane, etc.), etc. Accordingly, the roll of material may be unrolled and rerolled multiple times in this example. Advantageously, this exemplary embodiment may allow production with higher capacity (e.g., line speed of about 3 meters per minute, etc.) and/or may allow for larger patterns (e.g., the fabric with can go up to 1.5 meters wide, etc.) as compared to a conventional batch process.

In various exemplary embodiments, a roll of material (e.g., a roll of fabric material, etc.) configured for selective plating includes a substrate (e.g., a fabric substrate, etc.) having one or more insulation portions and one or more plating portions. The one or more insulation portions are defined on the substrate by an insulating ink (e.g., silicone-based ink, etc.) printed or otherwise applied to the substrate. The one or more plating portions are defined by or coincide with the areas or portions of the substrate devoid of insulating ink or that do not have any insulating ink thereon. In other words, the one or more plating portions are defined by the absence of insulating ink on the substrate. Stated differently, the one or more plating portions are defined at locations along the substrate at which the insulating ink is not present.

The insulating ink may be printed or otherwise applied to the substrate in a predetermined pattern. By way of example, the insulating ink may comprise a high molecular organic polymer-modified polydimethylsiloxane solution, (or fluoride modified polydimethylsiloxane solution) that is coated on substrate in a desired pattern. Also by way of example, the insulating ink may be applied to the substrate by gravure printing in which an image of the pattern is engraved onto an image carrier in the form of a cylinder of a rotary printing press. Alternatively, the insulating ink may be applied to the substrate via other processes, such as ink jet printing, spray coating, a print nozzle, brushing, screen printing, pad printing, stencil printing, roller coating, other printing methods, etc.

The insulating ink may then be allowed to dry on the substrate. For example, the insulating ink may be dried on the substrate when the roll of material is unrolled and in an oven at a temperature of about 100 degrees Celsius for about 10 minutes to make sure the ink has cured. In other exemplary embodiments, this drying step may be eliminated and/or the insulating ink may be allowed to dry at room temperature or other suitable temperature.

A catalyst coating may then be applied (e.g., via a dip and nip process, etc.) to the one or more plating portions of the substrate that do not have the insulating ink thereon. For example, the entire substrate may be dipped into a catalyst coating (e.g., butadiene acrylonitrile with palladium, etc.). The catalyst coating may comprise complexes of palladium and amine dispersed into a butadiene acrylonitrile solution. The entire fabric (roll) substrate may be dipped into the catalyst coating and then undergo a pressurized nip to remove excess coating, followed by drying. The dipping time may be just a few seconds, e.g., about 3 to 12 seconds, etc. By way of example, the catalyst coating may comprise a catalyst as disclosed in U.S. Pat. No. 5,082,734, the entire contents of which are incorporated herein by reference.

The catalyst coating will remain on (e.g., adhere or stick to, etc.) the substrate where the insulating ink is not located, e.g., at the one or more plating portions. But the catalyst coating will not remain or be present at the one or more insulating portions due to the presence of the insulating ink as the catalyst coating will not adhere or stick to insulating ink. Accordingly, the catalyst coating will be removed from and not remain on the insulating ink after the nipping process. But the catalyst coating will remain on the one or more plating portions and thereby provide a catalytic surface at e.g., for electroless deposition of metal plating.

The catalyst coating may be dried, e.g., at about 180 degrees Celsius for about 15 minutes, etc. Then, the substrate having the insulating ink and catalyst coating thereon may undergo an electroless plating process. During the electroless plating process, metal plating may be electrolessly deposited on the one or more plating portions of the substrate having the catalytic surfaces due to the presence of the catalyst coating. But the one or more insulating portions of the substrate having the insulating ink printed thereon will not have and will be free of metal plating. In some example embodiments, substantially no over-plating occurs on the insulation portion(s) from the plating of the plating portion(s) due at least in part to the insulating ink on the insulation portions. Accordingly, the insulating ink may be configured to insulate the one or more insulation portions from over-plating during the electroless plating process. By way of example, electroless nickel may be deposited at about 30 to 70 degrees Celsius for about 1 to 3 minutes, and/or the electroless copper may be deposited at about 40 to 60 degrees Celsius for about 10 to 30 minutes. Also by way of example, the electroless plating process may comprise an electroless plating process as disclosed in any one or more of U.S. Pat. No. 4,910,072, 5,075,037, 5,227,223, 5,328,750, 5,403,649, 5,411,795, and 5,437,916, the entire contents of which are incorporated herein by reference.

In alternative embodiments, electrically-conductive ink (e.g., a printable ink comprising butadiene acrylonitrile polymer with silver and/or palladium filler, etc.) may be printed or otherwise applied to a substrate (e.g., polyester taffeta fabric, other fabric substrate, etc.). Then, the substrate having the electrically-conductive ink thereon undergoes electroless plating as described above. During the electroless plating process, metal plating is electrolessly deposited only on the electrically-conductive ink. Metal plating does not occur on the fabric at portions that do not include the electrically-conductive ink. An electrolytic plating of metal (e.g., nickel, tin, gold, silver, cobalt, aluminum, zinc, copper, etc.) may be disposed on the metal plating. For example, a layer of nickel may be electrolytically plated onto the metal plating, whereby the nickel layer provides corrosion resistance. Also in these alternative embodiments, the insulating ink printing process is not required. In addition, the roll of material may go through a series of unrolling and rerolling steps at each of the above printing and plating processes (e.g., FIGS. 10 through 12, etc.).

FIG. 1 illustrates an exemplary embodiment of a material 20 configured for selective plating according to aspects of the present disclosure. The material 20 includes a substrate 24 (e.g., a fabric substrate, etc.) on which there is a pattern 28 defined by an insulating ink 44 and a catalyst coating 40. The insulating ink 44 defines insulation portions 36 along the substrate 24 at which the insulating ink 44 is located. The catalyst coating 40 defines one or more plating portions 32 along the substrate 24.

Specifically and for example, the insulation portions 36 are printed (e.g., via gravure printing, inkjet printing, etc.) with an insulating ink 44 (e.g., silicone-based ink, etc.) to which the catalyst coating 40 will not adhere. The plating portions 32 are those portions of the substrate 24 that were not provided with the insulating ink 44. Accordingly, the catalyst coating 40 (e.g., about 0.1 ounces per square yard, etc.) adheres and remains on the plating portions 32 when the substrate 24 is dipped into the catalyst coating 40 (e.g., butadiene acrylonitrile with palladium, etc.). The catalyst coating 40 on the substrate 24 provides or defines catalytic surfaces for electroless deposition of metal. It should be noted that for simplicity and clarity of description, elements shown in the figures are not necessarily drawn to scale. Also for simplicity and clarity, the dimensions of some elements may be exaggerated relative to other elements, and adjoining elements may be shown in the drawings as being more definitively delineated from each other than might be the case in some actual embodiments.

Figure 2:
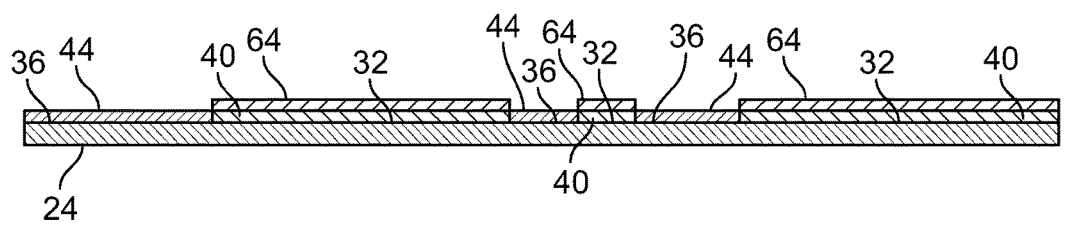
FIG. 2 is a side view of a selectively plated material according to an exemplary embodiment.

FIG. 2 shows the material 20 from FIG. 1 after being selectively plated according to one example embodiment. As shown, metal plating 64 is provided, e.g., electrolessly deposited, on the catalyst coating 40 of the plating portions 32. An electrolytic plating of metal (e.g., nickel, tin, gold, silver, cobalt, aluminum, zinc, copper, etc.) may be disposed on the metal plating 64. For example, a layer of nickel may be electrolytically plated onto the metal plating 64, whereby the nickel layer provides corrosion resistance. Substantially no metal plating is present on the insulating ink 44 of the insulation portions 36. In the present example embodiment, the plating portions 32 are electrically conductive, whereas the insulation portions 36 are not electrically conductive.

Figure 3:
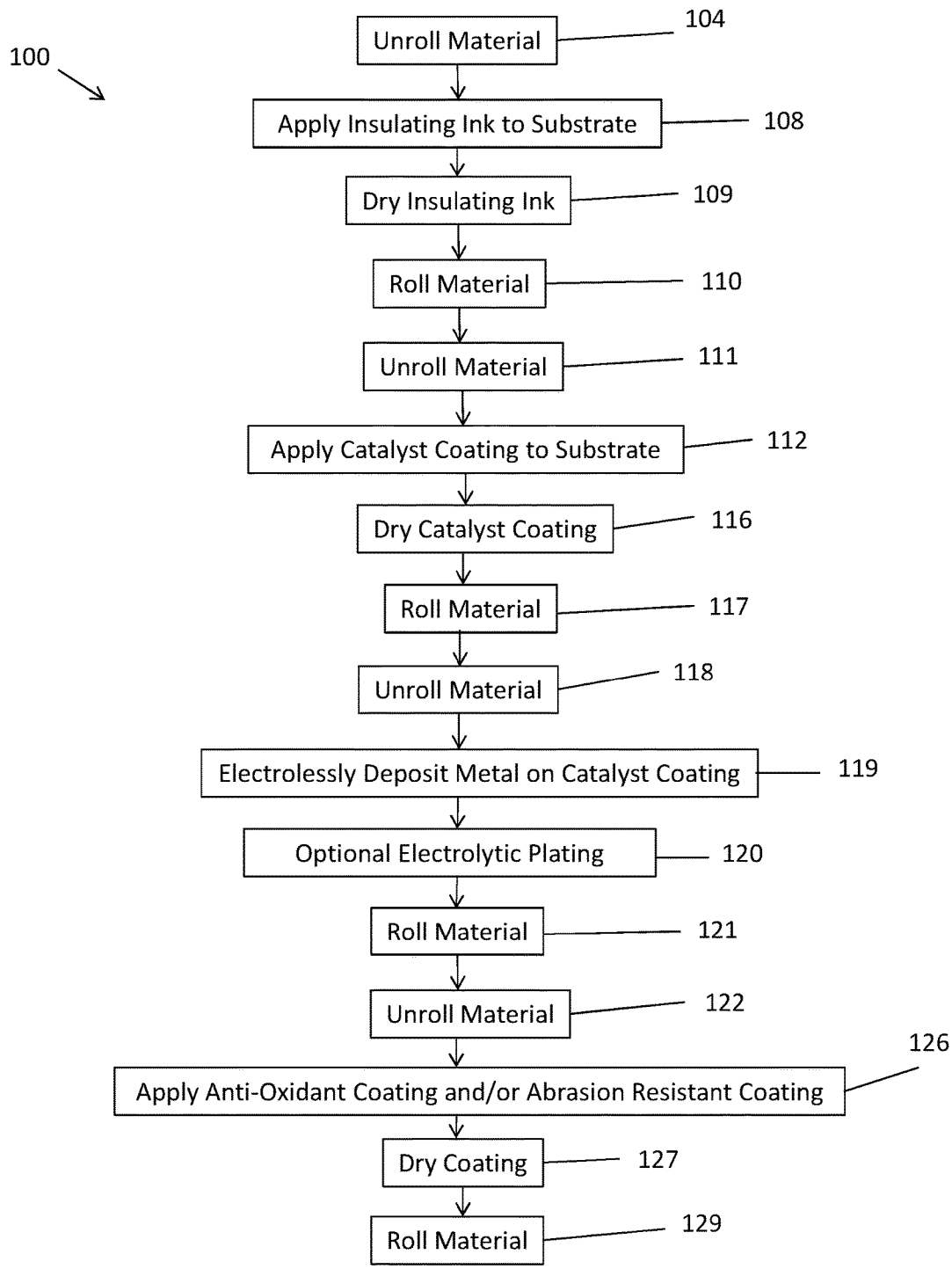
FIG. 3 is a flow diagram of a method of selectively plating a material according to an exemplary embodiment in which the material is printed with a pattern of insulating ink and plated.

A flow diagram of one example method of selectively plating a roll of material, such as a roll of fabric, is indicated generally in FIG. 3 by reference number 100. During this exemplary method, the material may go through a through a series of unrolling and rerolling steps at each process while the roll of material is being selectively plated. For example, process 104 may include unrolling the roll of material. In process 108, insulating ink is printed (e.g., via gravure or screen printing, etc.) or otherwise applied in a pattern along a substrate. The insulating ink defines insulation portions on the substrate. The absence of insulating ink at locations along the substrate defines plating portions. After the insulating ink is dry 109, the material may then be rerolled at process 110 and unrolled again at process 111. In process 112, a catalyst coating is coated (e.g., via a dip and nip process, etc.) or otherwise applied to the plating portions after the insulating ink has dried. In process 116, the catalyst coating may be dried, e.g., at about 180 degrees Celsius for about 15 minutes, etc. After the catalyst coating is dry, the material may then be rerolled at process 117 and unrolled again at process 118. Process 119 includes electrolessly depositing metal onto the catalyst coating on the plating portions. For example, the substrate may be exposed to a plating solution. As catalysis progresses, metal plating accumulates on the catalyst coating on the plating portions. By way of example only, a roll of fabric after being catalyzed may be dipped into an electroless copper solution at about 40 to 60 degrees Celsius (e.g., at about 48 degrees Celsius, etc.) for copper plating deposited for about 10-30 minutes, and then dipped into a nickel aminosulfonate solution at about 40 to 60 degrees Celsius for nickel plating deposited for about 5 to 15 minutes. The optional process 120 includes electrolytic plating, e.g., nickel, tin, gold, silver, cobalt, aluminum, zinc, copper, etc. on the metal that was electrolessly deposited in process 119. For example, a layer of nickel may be electrolytically plated in process 120 onto the copper plating that was electrolessly deposited in process 119, whereby the nickel layer provides corrosion resistance.

The material may be rerolled at process 121 and unrolled again at process 122. In process 126, an anti-oxidant coating may be applied (e.g., by dipping, spray coating, brushing, etc.) and/or an abrasion resistant coating (e.g., urethane coating, etc.) may be applied to the metal plating and the non-plated portions of the substrate. For example, the anti-oxidant coating may comprise a knife coated thickening polyurethane solution. Or, for example, the substrate including the plated metal may be dipped into a water-based polyurethane coating to thereby apply the coating (e.g., about 0.1 ounces per square yard, etc.). The water-based polyurethane coating may improve flexing performance and help keep the metal plating from breaking or flaking off when bent or flexed. After the coating is dry 127, the material may then be rerolled at process 129.

Figure 10:
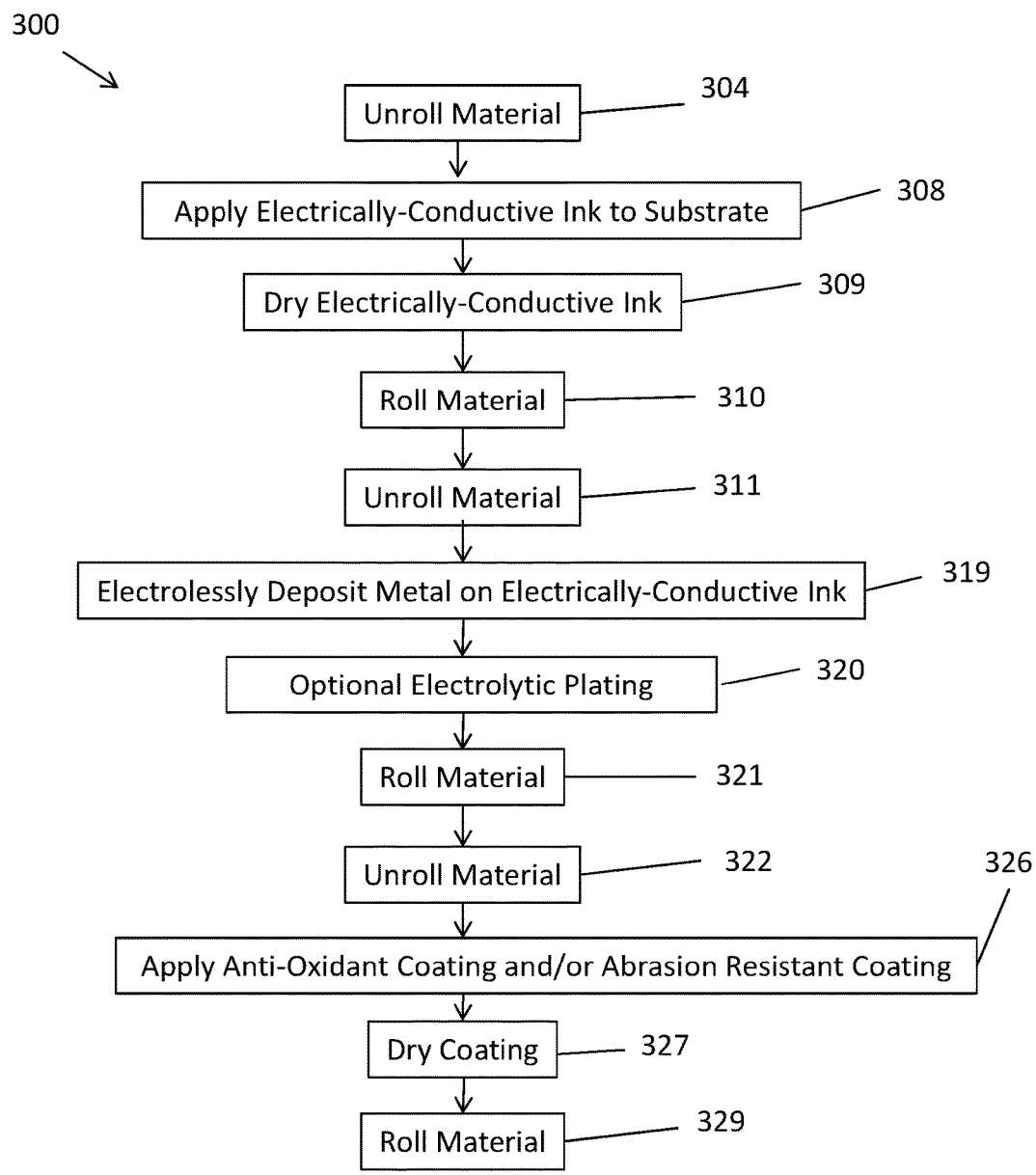
FIG. 10 is a flow diagram of a method of selectively plating a material according to an exemplary embodiment in which the material is printed with a pattern of electrically-conductive ink and plated.

A flow diagram of another example method of selectively plating a roll of material, such as a roll of fabric, is indicated generally in FIG. 10 by reference number 300. During this exemplary method, the material may go through a through a series of unrolling and rerolling steps at each process while the roll of material is being selectively plated. For example, process 304 may include unrolling the roll of material. In process 308, electrically-conductive ink (e.g., a printable ink comprising butadiene acrylonitrile polymer with silver and/or palladium filler, etc.) is printed or otherwise applied in a pattern along a substrate. After the electrically-conductive ink is dry 309, the material may then be rerolled at process 310 and unrolled again at process 311. Process 319 includes electrolessly depositing metal onto the electrically-conductive ink. For example, the substrate may be exposed to a plating solution such that metal plating accumulates on the electrically-conductive ink. By way of example only, a roll of fabric after being catalyzed may be dipped into an electroless copper solution at about 40 to 60 degrees Celsius (e.g., at about 48 degrees Celsius, etc.) for copper plating deposited for about 10-30 minutes, and then dipped into a nickel aminosulfonate solution at about 40 to 60 degrees Celsius for nickel plating deposited for about 5 to 15 minutes. The optional process 320 includes electrolytic plating, e.g., nickel, tin, gold, silver, cobalt, aluminum, zinc, copper, etc. on the metal that was electrolessly deposited in process 319. For example, a layer of nickel may be electrolytically plated in process 320 onto the copper plating that was electrolessly deposited in process 319, whereby the nickel layer provides corrosion resistance.

The material may be rerolled at process 321 and unrolled again at process 322. In process 326, an anti-oxidant coating may be applied (e.g., by dipping, spray coating, brushing, etc.) and/or an abrasion resistant coating (e.g., urethane coating, etc.) may be applied to the metal plating and the non-plated portions of the substrate. For example, the anti-oxidant coating may comprise a knife coated thickening polyurethane solution. Or, for example, the substrate including the plated metal may be dipped into a water-based polyurethane coating to thereby apply the coating (e.g., about 0.1 ounces per square yard, etc.). The water-based polyurethane coating may improve flexing performance and help keep the metal plating from breaking or flaking off when bent or flexed. The water-based polyurethane coating may also help improve abrasion resistance and help prevent or inhibit the fabric from fraying during die cutting. After the coating is dry 327, the material may then be rerolled at process 329.

Figure 11:
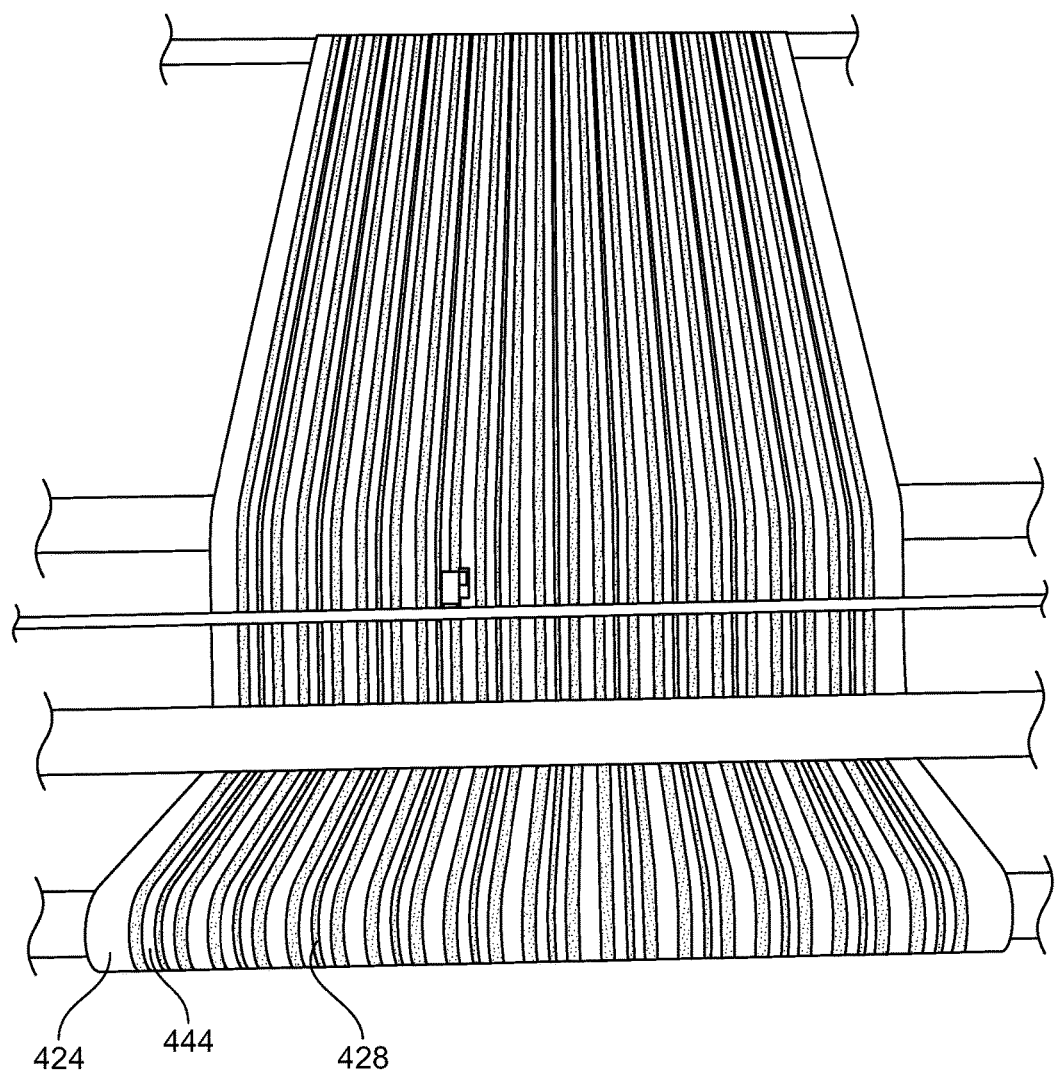
FIG. 11 illustrates a roll of material being unrolled according to an exemplary embodiment in which the material was printed with electrically-conductive ink.
Figure 12:
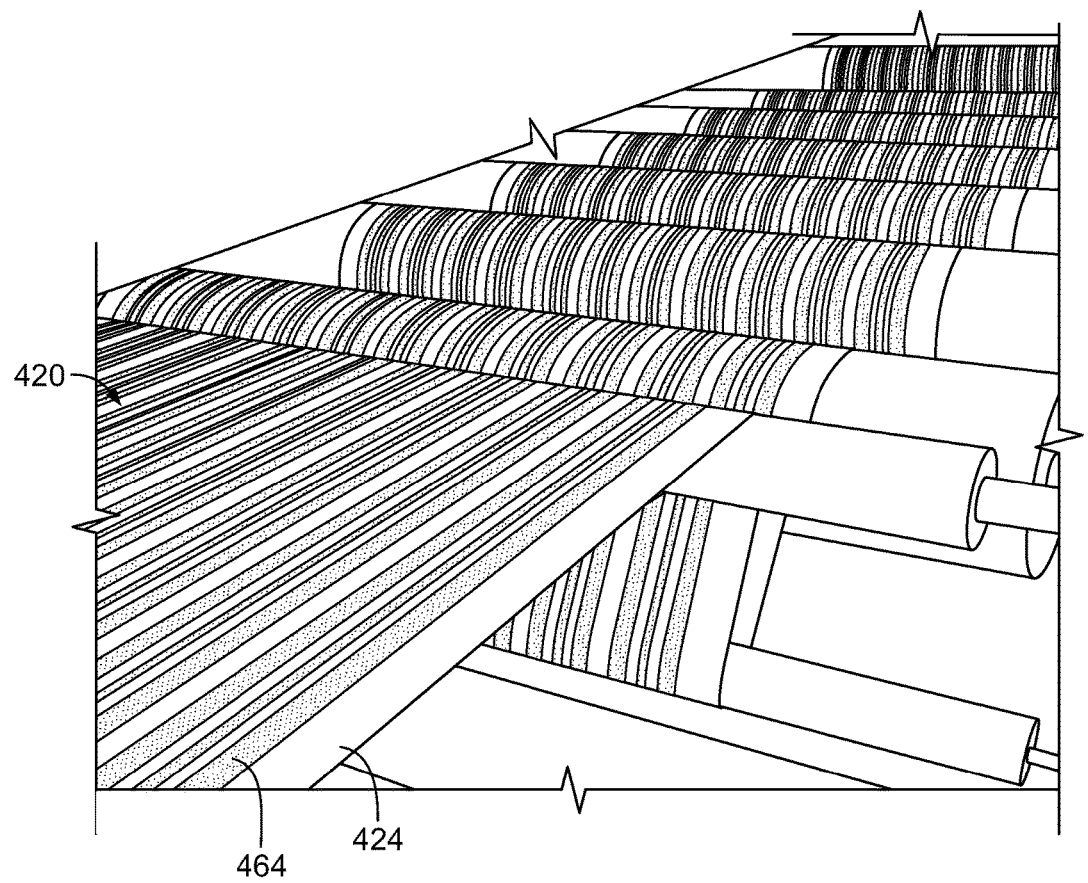
FIG. 12 illustrates the material printed with electrically-conductive ink of FIG. 11 undergoing a plating process to provide a metal plating on the electrically-conductive ink.
Figure 13:
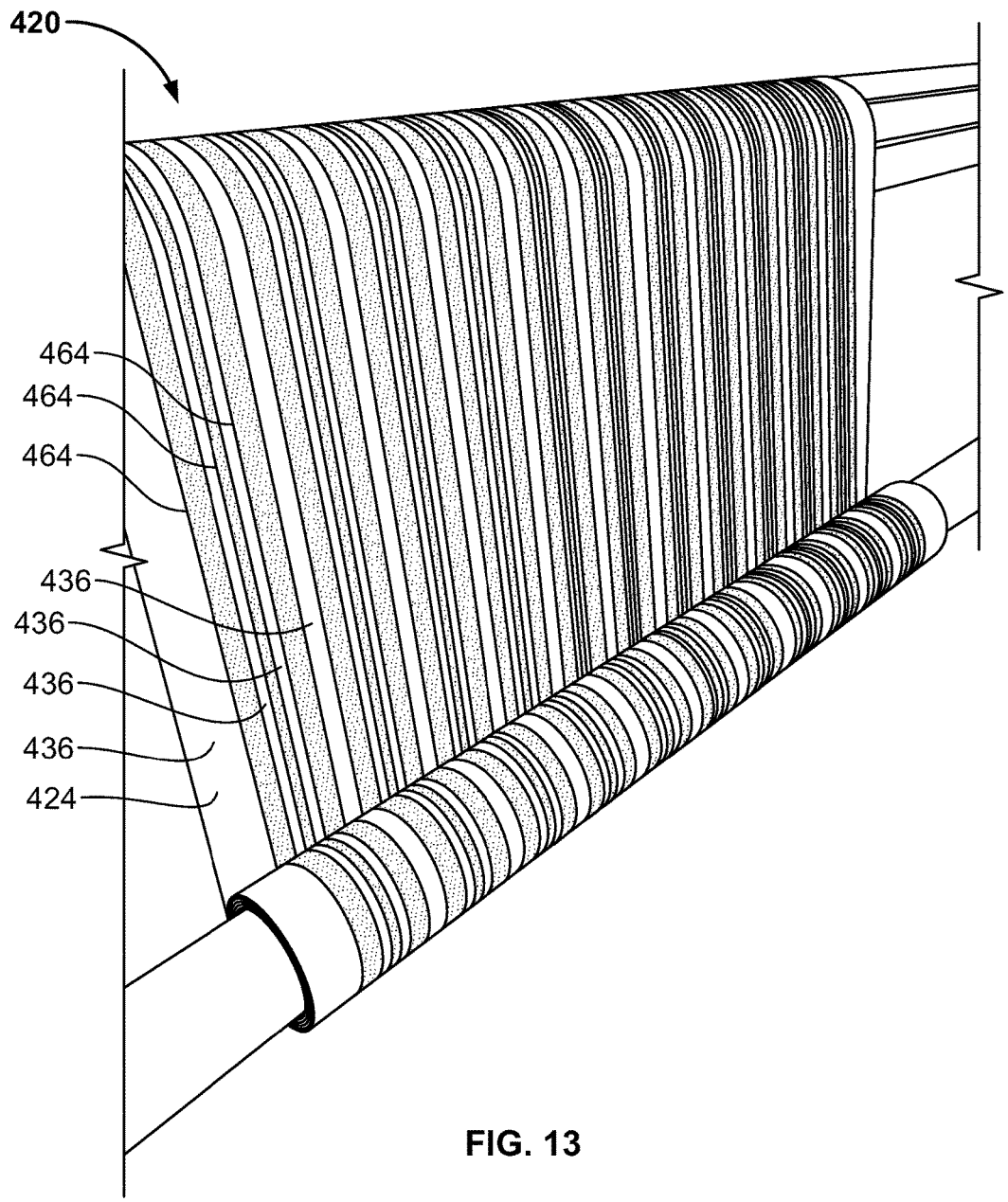
FIG. 13 shows the selectively plated material of FIG. 12 being rolled up.
Figure 14:
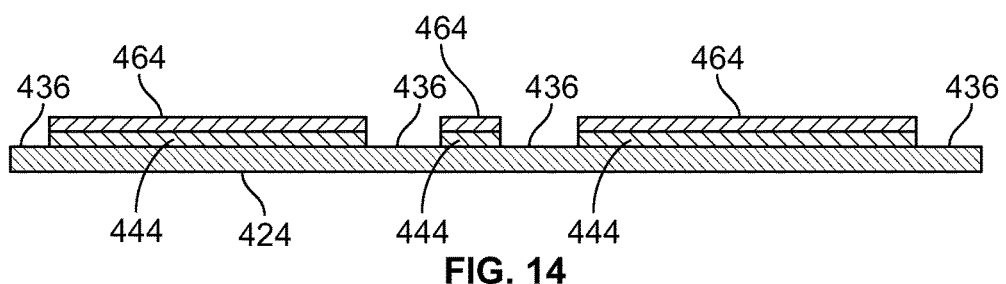
FIG. 14 is a side view of a portion of the selectively plated material shown in FIG. 13.

FIG. 11 shows a substrate 424 (e.g., a fabric substrate, etc.) having a stripe pattern 428 of electrically-conductive ink 444 being unrolled. FIG. 12 shows the substrate 424 with the stripe pattern 428 undergoing a plating process to provide a metal plating 464 on the electrically-conductive ink 444. FIG. 13 shows the selectively plated material 420 being rolled up. FIG. 14 is a side view of a portion of the selectively plated material 420. In this example, the metal plating 464 is electrolessly deposited along only the electrically-conductive ink 444 without over-plating the substrate 424 whereat the electrically-conductive ink 444 was not present. The metal plating 464 is electrically conductive, whereas the unplated portions 436 of the substrate 424 along the substrate's outermost edges and areas between the stripes of metal plating 464 are not electrically conductive. An electrolytic plating of metal (e.g., nickel, tin, gold, silver, cobalt, aluminum, zinc, copper, etc.) may be disposed on the metal plating 464. For example, a layer of nickel may be electrolytically plated onto the metal plating 464, whereby the nickel layer provides corrosion resistance.

A wide range of materials and substrates may be selectively plated as disclosed herein, including rolls of woven fabrics (e.g., roll of fabric having a plain weave, etc.), non-woven fabrics, knitted fabrics, rolls of fabrics woven on one side and non-woven on the other side, other materials, etc. By way of example, the substrate may comprise polyester woven or non-woven fabrics, polyester taffeta, polyester taffeta laminates, nylon or nylon rip-stop (NRS) fabrics or laminates, other rip-stop fabrics or laminates, textiles, etc.

EXAMPLES

By way of example only and not for purposes of limitation, a description will now be provided of exemplary methods for making, producing, or forming selectively plated fabrics.

Example 1

Figure 4:
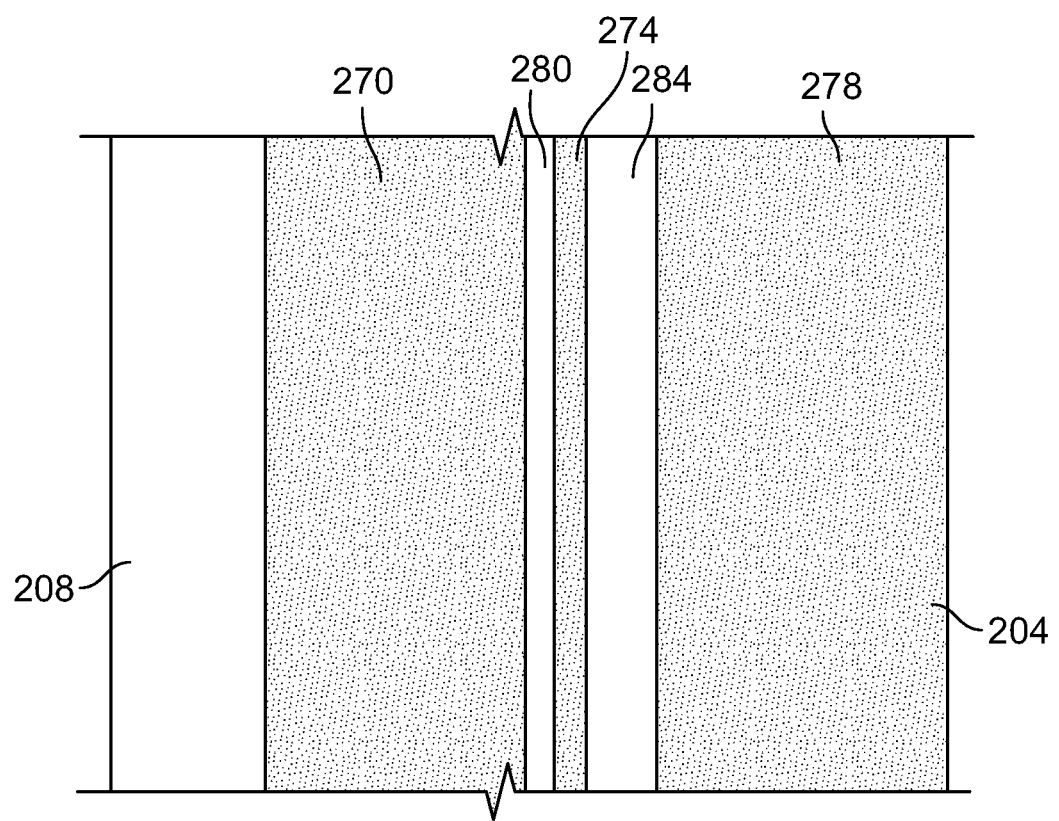
FIG. 4 is a top view of part of a fabric sample printed with a pattern of insulating ink and then plated according to an exemplary embodiment.

In this Example 1, the sample included a fabric substrate made of polyester taffeta (e.g., about 100 meters long and about 1 meter wide, etc.) that was selectively plated as follows. Insulating ink was printed on the fabric in a stripe pattern, part of which is shown in FIG. 4. The insulating ink was a silicone-based ink. After the insulating ink dried, a catalyst coating (e.g., butadiene acrylonitrile with palladium, etc.) was applied to the portions of the fabric substrate that did not have the insulating ink printed thereon. The catalyst coating was dried, e.g., at about 180 degrees Celsius for about 15 minutes, etc.

The sample went through a plating process in which a copper solution was used to electrolessly deposit copper plating onto the catalyst coating. The electroless copper solution content may comprise about 1 to 4 grams/per liter (g/L) copper ion, about 2 to 8 g/L sodium hydroxide, about 15 to 40 g/L EDTA (ethylenediamine tetra-acetic acid), and about 2 to 8 g/L formaldehyde. After the electroless plating process, a layer of electrolytic nickel plating was added next in sufficient quantity to completely cover the copper and enhance the corrosion resistance of the fabric, followed by a water-based polyurethane coating (e.g., about 0.1 ounces per square yard, etc.) was applied.

Figure 5:
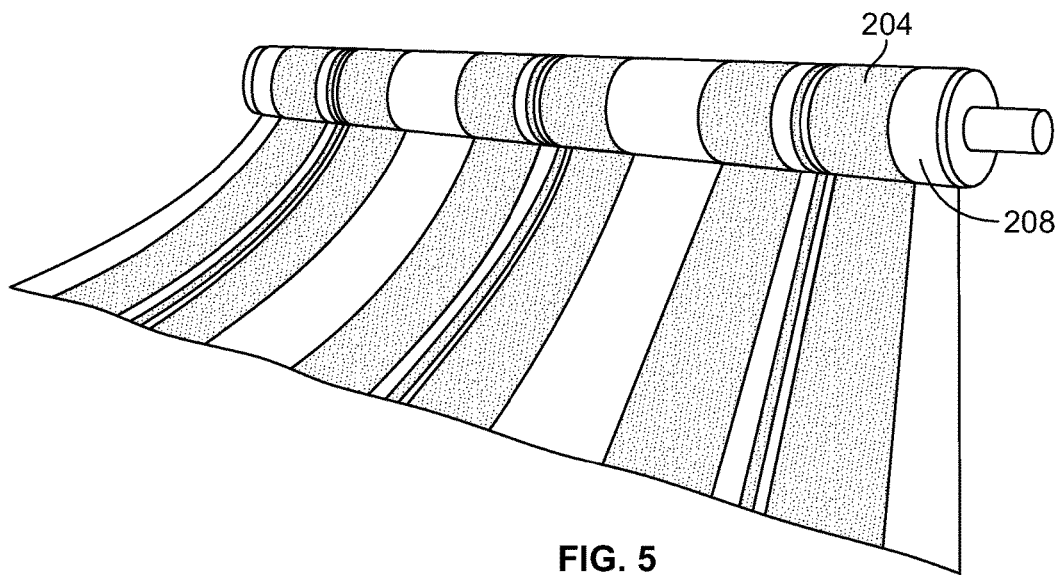
FIG. 5 illustrates a roll of material selectively plated according to an exemplary embodiment in which the material was unrolled and printed with a pattern of insulating ink, rerolled, and then unrolled and plated before being rerolled again.

The sample was visually inspected. The first 80 meters of the sample appeared to have been satisfactorily plated. The sample (FIG. 5) exhibited good plating and no over-plating along the full length of the sample (e.g., about 100 meters long, etc.). Plating portions 204 and insulation portions 208 along the roll of material are shown in FIG. 5.

Example 2

Figure 6:
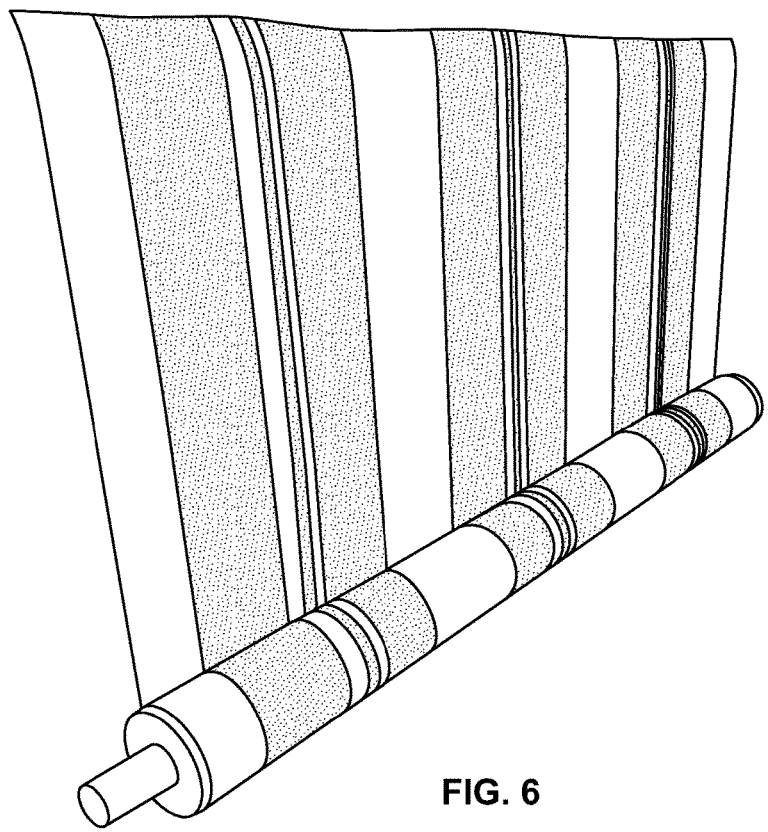
FIG. 6 illustrates another roll of material selectively plated according to an exemplary embodiment in which the material went through a series of unrolling and rerolling steps as the material was printed with a pattern of insulating ink and then plated.

In this Example 2, the sample was prepared using same procedure as in Example 1. The fabric was treated with urethane, e.g., a water-based polyurethane coating (e.g., about 0.1 ounces per square yard, etc.). After the plating process was completed, the sample was visually inspected. The sample exhibited good plating, good appearance, and no over-plating. The sample is shown in FIG. 6. Metal-plated traces and insulation areas between the metal-plated traces (shown in FIG. 4) were tested for surface resistivity. The testing results are shown in Table 1 below. FIG. 4 shows the locations of the plated portions or traces 270, 274, and 278, the unplated portion 280 between the metal-plated traces 270 and 274, and the unplated portion 284 between the metal-plated traces 274 and 278 are listed in TABLE 1 below.

TABLE 1

| Surface resistivity (s-r ohm/sq) | | | |
|---|---|---|---|
| | 1 | 2 | 3 |
| Trace 270 | 0.034 | 0.028 | 0.03 |
| Trace 274 | 0.073 | 0.076 | 0.082 |
| Trace 278 | 0.031 | 0.029 | 0.036 |

| Thickness (mm) | |
|---|---|
| Trace 270 | 0.045 |
| Trace 274 | 0.046 |
| Trace 278 | 0.045 |
| Unplated portion 280 | 0.041 |
| Unplated portion 284 | 0040 |

| Width (mm) | |
|---|---|
| Trace 270 | 86.2 |
| Trace 274 | 9.7 |
| Trace 278 | 95.1 |
| Unplated portion 280 | 9.7 |
| Unplated portion 284 | 22.6 |

Example 3

Figure 7:
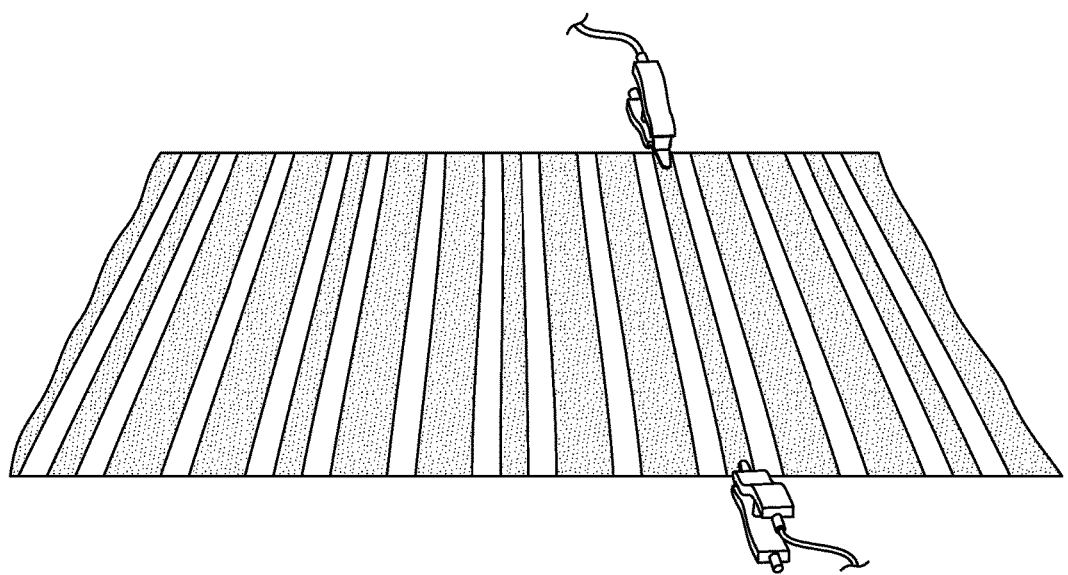
FIG. 7 illustrates a sample of material selectively plated according to an exemplary embodiment.

In this Example 3, the sample was prepared using the same procedure as in Example 1. The sample included copper-plated areas (traces) having widths of 1 centimeter and 2 centimeters. The fabric had a plain weave and was provided as a roll having a width of 145 centimeters. The sample was 12 inches long. As shown in FIG. 7, point-to-point trace resistance measurements were taken across the lengths of the traces using a Keithley 580 micro-ohmmeter and 4-wire alligator clips. The measurements were taken at a temperature of 24 C and 63% relative humidity. The measured resistances are shown in Table 2 below.

TABLE 2

Selectively Plated Fabric Point to Point Trace Resistance - 12" Lengths 145 cm wide roll of plain weave

| 1 cm Trace Width | | 2 cm Trace Width | | | |
|---|---|---|---|---|---|
| 1 | 1.393 | 2 | 0.639 | 3 | 0.643 |
| 4 | 1.342 | 5 | 0.607 | 6 | 0.628 |
| 7 | 1.349 | 8 | 0.606 | 9 | 0.618 |
| 10 | 1.339 | 11 | 0.636 | 12 | 0.643 |
| 13 | 1.421 | 14 | 0.637 | 15 | 0.655 |
| 16 | 1.404 | 17 | 0.629 | 18 | 0.657 |
| 19 | 1.318 | 20 | 0.648 | 21 | 0.676 |
| 22 | 1.431 | 23 | 0.649 | 24 | 0.650 |
| 25 | 1.562 | 26 | 0.636 | 27 | 0.652 |
| 28 | 1.442 | 29 | 0.649 | 30 | 0.647 |
| 31 | 1.428 | 32 | 0.655 | 33 | 0.687 |
| 34 | 1.490 | 35 | 0.826 | 36 | 0.692 |
| 37 | 1.529 | 38 | 0.741 | | |
| Average | 1.419 | | | | 0.656 |

Example 4

Figure 9:
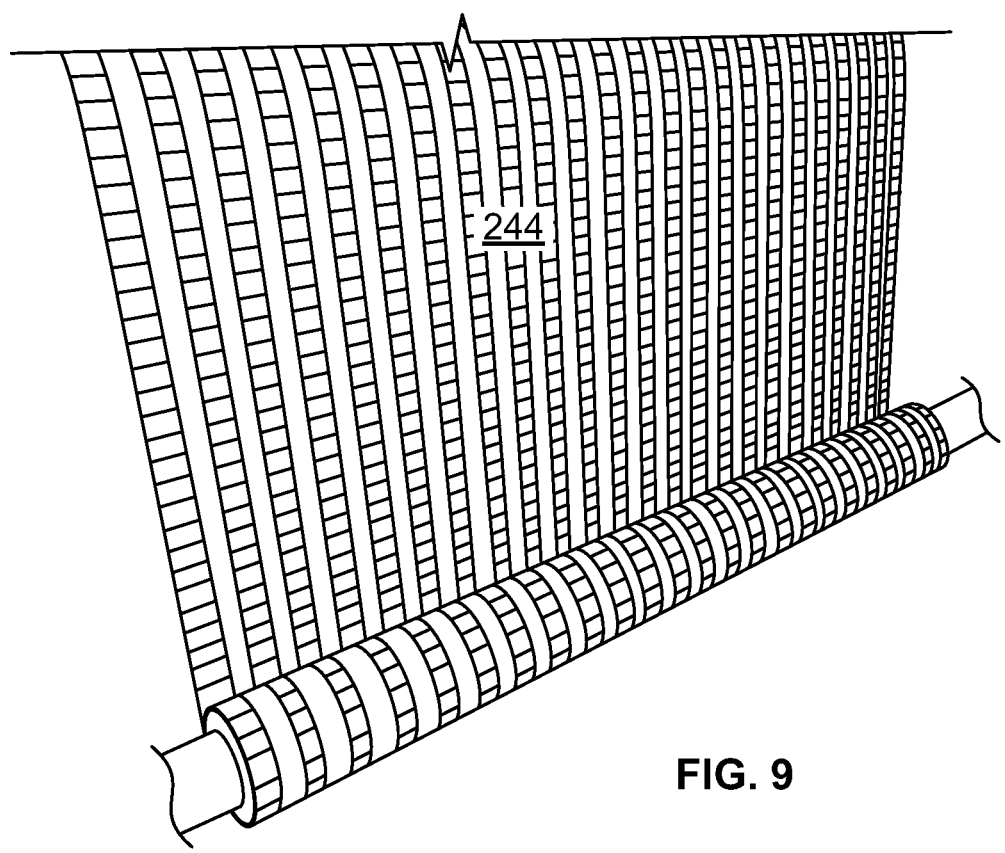
FIG. 9 illustrates a roll of material selectively plated according to an exemplary embodiment in which the material was printed with a pattern of insulating ink and then plated as the material went through a series of unrolling and rerolling steps during the printing and plating processes.

In this Example 4, the sample 244 (FIG. 9) included a substrate made of polyester taffeta (e.g., about 1 meter wide from top to bottom in FIG. 9, etc.) that was selectively plated as follows.

Figure 8:
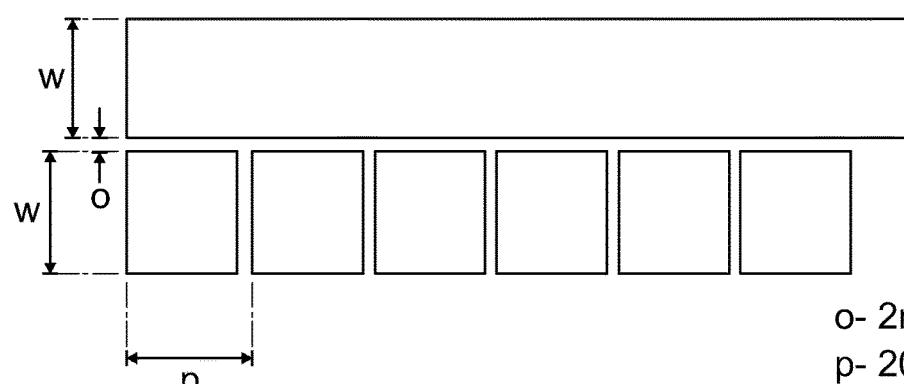
FIG. 8 illustrates an example pattern in which insulating ink may be printed on a substrate, whereby the insulating ink defines areas on the substrate that will not be plated and the areas without any insulating ink on the substrate will be selectively plated according to an exemplary embodiment.

Insulating ink was printed on the fabric in a pattern, part of which is shown in FIG. 8. The pattern included six 20-millimeter squares and one 20-millimeter wide rectangle. The pattern was repeatedly printed (e.g., via gravure printing, inkjet printing, etc.) onto the sample. Spacing between the squares and rectangle was 2 millimeters. The spacing areas received the insulating ink. The squares and rectangles represent areas that were devoid of the insulating ink or that did not have any insulating ink thereon.

The squares and rectangles would receive a catalyst coating as it would not stick or adhere to the insulating ink. After the insulating ink dried, a catalyst coating (e.g., butadiene acrylonitrile with palladium, etc.) was applied to the portions of the substrate that did not have the insulating ink printed thereon. The catalyst coating was dried, e.g., at about 180 degrees Celsius for about 15 minutes, etc. The insulating ink was a silicone-based ink.

The sample went through a catalyzing process in which a copper solution was used to electrolessly deposit copper plating onto the catalyst coating. The sample plated at very low speed (2.5 feet per minute), but surface resistance remained between 0.05 and 0.07 ohms per square from beginning to end. In this example, the electroless copper solution content comprised about 1 to 4 grams/per liter (g/L) copper ion, about 2 to 8 g/L sodium hydroxide, about 15 to 40 g/L EDTA (ethylenediamine tetra-acetic acid), and about 2 to 8 g/L formaldehyde. When the plating process was completed, a corrosion inhibitor coating (e.g., benzotriazole (BTA), etc.) was applied (e.g., via a dip process, etc.). The sample (e.g., about 100 meters long, etc.) was visually inspected. Metal-plated portions on the plated sample were tested for surface resistivity and measured for thickness. Dimensions "o", "p" and "w" (or opening, pitch, and width) of the spacing areas (shown in FIG. 8) also were measured. The testing results are shown in Table 3 below, which includes five different measurements taken at different locations across the width of the roll about 6 inches apart. There was no measurable conductivity found in the unplated stripes 208 between the plated areas 204.

TABLE 3

| 1 | 2 | 3 | 4 | 5 |
| --- | --- | --- | --- | --- |
| Surface resistivity (s-r ohm/sq): | | | | |
| 0.083 | 0.080 | 0.076 | 0.072 | 0.075 |
| Thickness (mm): | | | | |
| 0.051 | 0.052 | 0.053 | 0.051 | 0.050 |
| Spacing (mm): | | | | |
| o | | p | | w |
| 2.0 | | 20.3 | | 19.5 |

Example 5

In this Example 5, the sample included a fabric substrate made of polyester taffeta (e.g., about 100 meters long and about 1 meter wide, etc.) that was selectively plated as follows. Electrically-conductive ink (e.g., a printable ink comprising butadiene acrylonitrile polymer with silver filler, etc.) was printed on the fabric in a stripe pattern. Then, the fabric having the electrically-conductive ink thereon underwent electroless copper and electrolytic nickel plating processes.

More specifically, the sample went through a plating process in which a copper solution was used to electrolessly deposit copper plating onto the electrically-conductive ink. The electroless copper solution content may comprise about 1 to 4 grams/per liter (g/L) copper ion, about 2 to 8 g/L sodium hydroxide, about 15 to 40 g/L EDTA (ethylenediamine tetra-acetic acid), and about 2 to 8 g/L formaldehyde. After the electroless plating process, a layer of electrolytic nickel plating was added next in sufficient quantity to completely cover the copper and enhance the corrosion resistance of the fabric, followed by a water-based polyurethane coating (e.g., about 0.1 ounces per square yard, etc.) was applied.

The sample (e.g., about 100 meters long, etc.) was visually inspected. The sample exhibited good plating and no over-plating along the full length of the sample (e.g., about 100 meters long, etc.). The metal-plated portions of the sample were tested for surface resistivity. The testing results are shown in Table 4 below, which includes five different measurements taken at different locations across the width of the roll about 6 inches apart. There was no measurable conductivity found in the unplated portions along the substrate's outermost edges and areas between the stripes of metal plating.

TABLE 4

| Surface resistivity (s-r ohm/sq): | | | | |
| --- | --- | --- | --- | --- |
| 1 | 2 | 3 | 4 | 5 |
| 0.042 | 0.042 | 0.043 | 0.041 | 0.045 |

The sample also underwent abrasion resistance or adhesion testing as described below, which generally estimates how much metal is removed after rubbing. The sample was tested without a urethane coating. During this testing, the sample achieved a 4 rating, a 3 rating, and a 4 rating. The sample was then tested after being coated with urethane. The urethane-coated sample achieved a 5 rating or grade in three different tests. Advantageously, the urethane coating thus helped to improve the abrasion resistance. In addition, the urethane coating also helps to prevent or inhibit the fabric from fraying during die cutting.

The abrasion resistance testing process used for the sample in this Example 5 is disclosed in U.S. Pat. No. 5,411,795. Abrasion resistance is characterized by measuring the weight loss of the fabric caused by abrasion from the reciprocating rubbing of an acrylic finger back and forth over the fabric surface within a slotted bracket. The acrylic finger was mounted under the end of a weighted reciprocating arm. This testing used a modified Crockmeter where the acrylic finger was provided with a 9.5 mm (⅜ inch) diameter, flat bottomed tip under a 3.1 kilogram load which completed 50 reciprocal rubbings (i.e., 25 cycles) over the sample, which was coated with 2 layers of adhesive tape. After the rubbing, the adhesive tape was pulled from the fabric to determine the amount of metal removed by the tape as compared against standards set forth in the figure of U.S. Pat. No. 5,411,795. Generally, a "5 RATING" applies to a sample where metal adhesion to the substrate is so good that only a very slight amount of metal is removed by the adhesive tape after rubbing using the modified Crockmeter; a "4 RATING" applies where more metal is removed so that the outline of the path of the acrylic finger is barely visible; a "3 RATING" applies where sufficient metal is removed so that a distinct outline of the finger's path is clearly visible; a "2 RATING" applies where the rubbed pathway is completely filled in with metal; and a "1 RATING" applies where the path filled and metal is adhered to areas of the tape outside of the path of the finger.

In an exemplary embodiment, a roll of material generally includes a substrate, an insulating ink on the substrate, and a catalyst coating on the substrate whereat the insulating ink is not present. The substrate may include one or more insulation portions and one or more plating portions. The insulating ink may be in a pattern on the substrate that defines the one or more insulation portions. The one or more plating portions may be defined by or coincide with areas in the pattern devoid of the insulating ink. The one or more plating portions may include the catalyst coating, which is configured to provide the substrate with one or more catalytic surfaces for electroless deposition of metal. The roll of material may further include a metal plating (e.g., copper, etc.) electrolessly deposited on the catalyst coating without over-plating the insulating ink, whereby the insulating ink is devoid of metal plating. An electrolytic plating (e.g., nickel, tin, gold, silver, cobalt, aluminum, zinc, copper, etc.) may be disposed on at least the metal plating. An anti-oxidant coating and/or an abrasion resistant coating may be disposed on at least the metal plating. A water-based polyurethane coating may be disposed on at least the metal plating that inhibits the metal plating from breaking or flaking off when bent or flexed. A benzotriazole (BTA) corrosion inhibitor coating may be disposed on at least the metal plating. The insulating ink may comprise a silicone-based ink. The catalyst coating may comprise butadiene acrylonitrile and palladium. The substrate may comprise a polyester taffeta fabric.

In another exemplary embodiment, a selectively plated roll of material generally includes a substrate, an insulating ink on the substrate, a catalyst coating on the substrate whereat the insulating ink is not present, and a metal plating on the catalyst coating. The metal plating may be electrolessly deposited on the catalyst coating without over-plating the insulating ink, whereby the insulating ink is devoid of metal plating. The substrate may include one or more insulation portions and one or more plating portions. The insulating ink may be in a pattern on the substrate that defines the one or more insulation portions. The one or more plating portions may be defined by or coincide with areas in the pattern devoid of the insulating ink. The one or more plating portions may include the catalyst coating. An electrolytic plating (e.g., nickel, tin, gold, silver, cobalt, aluminum, zinc, copper, etc.) may be disposed on at least the metal plating. An anti-oxidant coating and/or an abrasion resistant coating may be disposed on at least the metal plating. A water-based polyurethane coating may be disposed on at least the metal plating that inhibits the metal plating from breaking or flaking off when bent or flexed. A benzotriazole (BTA) corrosion inhibitor coating may be disposed on at least the metal plating. The metal plating may comprise copper and/or nickel. The insulating ink may comprise a silicone-based ink. The catalyst coating may comprise butadiene acrylonitrile and palladium. The substrate may comprises a polyester taffeta fabric.

In a further exemplary embodiment, a selectively plated roll of material generally includes a substrate, an electrically-conductive ink on the substrate, and a metal plating on the electrically-conductive ink. The metal plating may be electrolessly deposited on the electrically-conductive ink without over-plating the substrate whereat the electrically-conductive ink is not present. An electrolytic plating (e.g., nickel, tin, gold, silver, cobalt, aluminum, zinc, copper, etc.) may be disposed on at least the metal plating. An anti-oxidant coating and/or an abrasion resistant coating may be disposed on at least the metal plating. A water-based polyurethane coating may be disposed on at least the metal plating that inhibits the metal plating from breaking or flaking off when bent or flexed. A benzotriazole (BTA) corrosion inhibitor coating may be disposed on at least the metal plating. The metal plating may comprise copper and/or nickel. The substrate may comprise a polyester taffeta fabric. The electrically-conductive ink may comprise butadiene acrylonitrile polymer with silver and/or palladium filler.

One exemplary method of selectively plating a roll of material generally applying an insulating ink on a substrate, applying a catalyst coating on the substrate such that the catalyst coating will be present on the substrate whereat the insulating ink is not present, and depositing a metal plating on the catalyst coating. The method may also include unrolling the roll of material before applying the insulating ink on the substrate and rerolling the material after applying the insulating ink on the substrate; and/or unrolling the roll of material before applying the catalyst coating on the substrate and rerolling the material after applying the catalyst coating on the substrate; and/or unrolling the roll of material before depositing a metal plating on the catalyst coating and rerolling the material after depositing a metal plating on the catalyst coating. The method may include electrolessly depositing the metal plating on the catalyst coating without over-plating the insulating ink, whereby the insulating ink is devoid of metal plating. The method may further include printing the insulating ink in a pattern on the substrate that defines one or more insulation portions on the substrate. The substrate may include one or more plating portions that are defined by or coincide with areas in the pattern devoid of the printed insulating ink. The one or more plating portions may include the catalyst coating. In this example, applying the insulating ink may comprise gravure printing or inkjet printing the insulating ink in a pattern on the substrate. The method may additionally include coating at least the metal plating with one or more of: an electrolytic plating of metal (e.g., nickel, tin, gold, silver, cobalt, aluminum, zinc, copper, etc.), an anti-oxidant coating, an abrasion resistant coating, a water-based polyurethane coating, and/or a benzotriazole (BTA) corrosion inhibitor coating. The method may include unrolling the roll of material before coating at least the metal plating and rerolling the material after coating at least the metal plating. The metal plating may comprise copper and/or nickel. The insulating ink may comprise a silicone-based ink. The catalyst coating may comprise butadiene acrylonitrile and palladium. The substrate may comprises a polyester taffeta fabric. This example method may be performed without over-plating the insulating ink.

Another example method of selectively plating a roll of material generally includes applying an electrically-conductive ink on a substrate, and electrolessly depositing a metal plating on the electrically-conductive ink. The method may further include unrolling the roll of material before applying the electrically-conductive ink on the substrate and rerolling the material after applying the electrically-conductive ink on the substrate; and/or unrolling the roll of material before electrolessly depositing a metal plating on the electrically-conductive ink and rerolling the material after electrolessly depositing a metal plating on the electrically-conductive ink. The electrically-conductive ink may comprise butadiene acrylonitrile polymer with silver and/or palladium filler(s). The metal plating may comprise nickel and/or copper. The substrate may comprise a polyester taffeta fabric. This example method may be performed without over-plating the substrate whereat the electrically-conductive ink is not present. The method may additionally include coating at least the metal plating with one or more of: an electrolytic plating of metal (e.g., nickel, tin, gold, silver, cobalt, aluminum, zinc, copper, etc.), an anti-oxidant coating, an abrasion resistant coating, a water-based polyurethane coating, and/or a benzotriazole (BTA) corrosion inhibitor coating.

Exemplary embodiments disclosed herein may provide one or more (but not necessarily any or all) of the following advantages over some existing methods for selectively plating fabrics and/or other materials. For example, exemplary embodiments disclosed herein exhibit good electrical performance and also are highly flexible. Some exemplary embodiments included urethane treatment (e.g., water-based polyurethane coating, etc.) that improved flexing performance and helped keep the metal plating from breaking or flaking off when bent or flexed. Because catalysis coating and hence the electroless plating occur only in desired, predetermined areas on a substrate, material costs can be reduced. Only selected areas of a pattern are plated, making it easier to control electroless copper activity during plating. Low resistivity can more easily be achieved, and overplating in unselected substrate areas can be avoided. In various embodiments, no additional steps, such as masking are needed after plating.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "has," "have," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A roll of material comprising:
a fabric substrate;
an insulating ink on the fabric substrate;
a catalyst coating on the fabric substrate whereat the insulating ink is not present; and
wherein:
the fabric substrate includes one or more insulation portions and one or more plating portions;
the insulating ink is in a pattern on the fabric substrate that defines the one or more insulation portions;
the one or more plating portions are defined by or coincide with areas in the pattern devoid of the insulating ink; and
the one or more plating portions include the catalyst coating, which is configured to provide the fabric substrate with one or more catalytic surfaces for electroless deposition of metal.

2. The roll of material of claim 1, further comprising a metal plating on the catalyst coating.

3. The roll of material of claim 2, wherein the metal plating is electrolessly deposited on the catalyst coating without over-plating the insulating ink, whereby the insulating ink is devoid of metal plating.

4. The roll of material of claim 3, wherein:
the metal plating comprises copper and/or nickel;
the insulating ink comprises a silicone-based ink;
the catalyst coating comprises butadiene acrylonitrile and palladium; and
the fabric substrate comprises a polyester taffeta fabric.

5. The roll of material of claim 2, further comprising one or more of:
an electrolytic plating disposed on at least the metal plating; and/or
an anti-oxidant coating disposed on at least the metal plating; and/or
a water-based polyurethane coating disposed on at least the metal plating that inhibits the metal plating from breaking or flaking off when bent or flexed; and/or
a benzotriazole (BTA) corrosion inhibitor coating disposed on at least the metal plating.

6. The roll of material of claim 1, wherein:
the insulating ink comprises a silicone-based ink;
the catalyst coating comprises butadiene acrylonitrile and palladium; and
the fabric substrate comprises a polyester taffeta fabric.

7. A method of selectively plating a roll of material, the method comprising
applying an insulating ink on a fabric substrate, applying a catalyst coating on the fabric substrate such that the catalyst coating will be present on the fabric substrate whereat the insulating ink is not present, and depositing a metal plating on the catalyst coating without over-plating the insulating ink, wherein:
the fabric substrate includes one or more insulation portions and one or more plating portions;
the insulating ink is in a pattern on the fabric substrate that defines the one or more insulation portions;
the one or more plating portions are defined by or coincide with areas in the pattern devoid of the insulating ink; and
the one or more plating portions include the catalyst coating on which the metal plating is deposited.

8. The method of claim 7, wherein
the method further comprises at least one or more of:
unrolling the roll of material before applying the insulating ink on the fabric substrate and rerolling the material after applying the insulating ink on the fabric substrate; and/or
unrolling the roll of material before applying the catalyst coating on the fabric substrate and rerolling the material after applying the catalyst coating on the fabric substrate; and/or
unrolling the roll of material before depositing the metal plating on the catalyst coating and rerolling the material after depositing the metal plating on the catalyst coating.

9. The method of claim 7, wherein the method includes electrolessly depositing the metal plating on the catalyst coating without over-plating the insulating ink, whereby the insulating ink is devoid of metal plating.

10. The method of claim 7, wherein
applying the insulating ink comprises printing the insulating ink in the pattern on the fabric substrate that defines the one or more insulation portions on the fabric substrate.

11. The method of claim 10, wherein applying the insulating ink comprises gravure printing or inkjet printing the insulating ink in the pattern on the fabric substrate.

12. The method of claim 7, wherein:
the metal plating comprises copper and/or nickel;
the insulating ink comprises a silicone-based ink;
the catalyst coating comprises butadiene acrylonitrile and palladium; and
the fabric substrate comprises a polyester taffeta fabric.

13. The roll of material of claim 2, further comprising an electrolytic plating disposed on at least the metal plating.

14. The roll of material of claim 2, further comprising an anti-oxidant coating disposed on at least the metal plating.

15. The roll of material of claim 2, further comprising a water-based polyurethane coating disposed on at least the metal plating that inhibits the metal plating from breaking or flaking off when bent or flexed.

16. The roll of material of claim 2, further comprising a benzotriazole (BTA) corrosion inhibitor coating disposed on at least the metal plating.

17. An electromagnetic interference shield comprising a portion of the roll of material of claim 2.

18. The roll of material of claim 1, wherein the insulating ink comprises a printable insulating ink that is printed in the pattern on the fabric substrate that defines the one or more insulation portions, such that the one or more plating portions are defined by or coincide with areas in the pattern devoid of the printed insulating ink.

19. The roll of material of claim 1, wherein the insulating ink comprises an inkjet printable ink that is inkjet printed in the pattern on the fabric substrate that defines the one or more insulation portions, such that the one or more plating portions are defined by or coincide with areas in the pattern devoid of the inkjet printed insulating ink.

20. The roll of material of claim 1, wherein the insulating ink comprises a gravure printable insulating ink that is gravure printed in the pattern on the fabric substrate that defines the one or more insulation portions, such that the one or more plating portions are defined by or coincide with areas in the pattern devoid of the gravure printed insulating ink.

* * * * *